US006531975B1

United States Patent
Trotter et al.

(10) Patent No.: US 6,531,975 B1
(45) Date of Patent: Mar. 11, 2003

(54) APPARATUS AND METHOD FOR MULTI-CHANNEL DIGITAL TO ANALOG CONVERSION OF SIGNALS WITH DIFFERENT SAMPLE RATES

(75) Inventors: Brian D. Trotter; Thomas D. Stein; Heling Yi; Jason P. Rhode; Timothy T. Rueger, all of Austin, TX (US)

(73) Assignee: Cirrus Logic, Incorporated, Austin, TX (US)

( * ) Notice: Subject to any disclaimer, the term of this patent is extended or adjusted under 35 U.S.C. 154(b) by 0 days.

(21) Appl. No.: 09/865,079

(22) Filed: May 24, 2001

(51) Int. Cl.$^7$ ................................................. H03M 1/66
(52) U.S. Cl. ........................ 341/144; 341/123; 341/141
(58) Field of Search ........................... 341/61, 122, 123, 341/144, 141

(56) References Cited

U.S. PATENT DOCUMENTS 5,155,385 A  * 10/1992  Gotoh et al. ................. 341/144
5,272,524 A  * 12/1993  Nagmo et al. ................. 358/41
5,521,946 A  *  5/1996  Main ........................... 375/350
6,169,747 B1 *  1/2001  Sartain et al. ................. 341/61
6,201,486 B1 *  3/2001  Chan et al. .................... 341/61

* cited by examiner

Primary Examiner—Howard L. Williams
(74) Attorney, Agent, or Firm—Skjerven Morrill MacPherson, LLP; Dan Shifrin

(57) ABSTRACT

An apparatus and method for converting digital input signals sampled at different rates to analog signals includes a digital to analog converter for each digital input signal. Each digital to analog converter receives a digital input signal and a clock signal corresponding to the sampling rate of the received digital input signal. The apparatus can also receive a set of sample rate signals indicating the sampling rate for each digital input signal. The sample rate signals are used to route each digital input signal, along with a corresponding clock signal, to a corresponding digital to analog converter (DAC). A clock error signal controls routing of the digital input signals to the DACs as well as operation of the DACs. A clock divider and ratio detector module generates the clock error signal based on intermediate clock error signals that correspond to the sample rates.

27 Claims, 5 Drawing Sheets

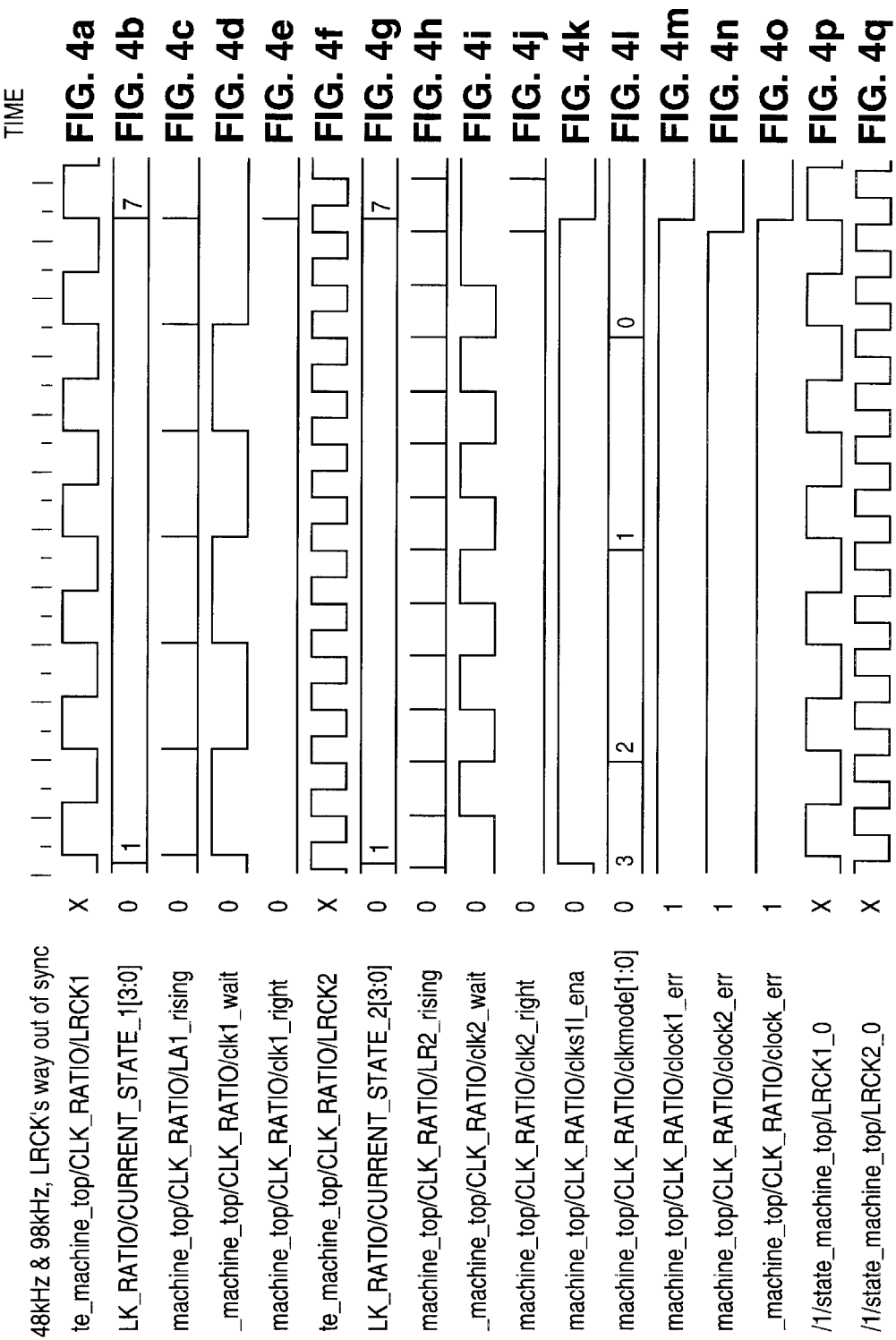

APPARATUS AND METHOD FOR MULTI-CHANNEL DIGITAL TO ANALOG CONVERSION OF SIGNALS WITH DIFFERENT SAMPLE RATES

BACKGROUND

A wide variety of audio formats at varying levels of specification and fidelity can be recorded on digital versatile disks (DVD's). One specification, known as DVD-Audio, supports formats such as Dolby Digital and digital theater systems (DTS) to provide multiple channels of audio for surround-sound effects.

PCM or "Pulse-Coded-Modulation" is the audio format standard for compact discs (CD's) and it is available on many DVD-Video's. DVD-Audio supports a significantly higher quality of PCM audio than is possible on CD or DVD-Video. Full multi-channel surround sound can be recorded in the PCM format to create a sound field with the ambience and fullness of a live performance. DVD-Audio PCM can be recorded with a range of frequencies that are more than four times that of a CD, thereby providing fidelity and dynamic range that is not possible on a CD.

With PCM, the ability to accurately represent an analog signal in digital form is mainly dependent upon the "sample size" and "sampling rate." The combination of sample size and rate are commonly represented as two numbers such as 24/96 meaning a 24-bit sample size taken at a rate of 96,000 samples per second.

Sample Size or "Quantization" is the number of data bits used to represent the analog audio signal each time it is sampled when being converted from an analog signal to a digital form. A larger number of bits allow the amplitude of the audio signal to be represented more accurately.

Sampling Rate or Sampling Frequency is the number of samples taken per second when converting the analog signal to digital. A higher "sampling rate" allows for higher frequencies to represented.

The greater the number of bits used for sample size and the greater the sample rate, the more accurately the analog signal can be represented in digital form. With a sample size of 24 bits and a sample rate of 192 KHz (24/192), DVD-Audio is capable of recording an audio signal with a frequency range of 0 to 96 KHz with a dynamic range of 144 dB.

In multi-channel recordings, the DVD-Audio PCM specification allows each track to be recorded with different sampling rates and sample sizes. For example, 24/96 can be used for the front channels and 16/48 for the rear. The DVD Audio specification currently mandates two channels of 192 kHz/24 bit and up to six channels of 96 kHz/24 bit. Other sample rates and word lengths can also be used such as 44.1, 48 or 88.2 kHz at either 16, 20 or 24 bits for one to six channels on any given program or track.

Additionally, combinations of sample rates and word lengths could be used. For example, a 5-channel music mix could be produced with the front three channels, left, center, and right delivered at 96-kHz/24 bit, and the left and right surround channels delivered at 48-kHz/16 bit.

Direct Stream Digital (DSD) is another digital encoding format used to record Super Audio CD (SACD), which are high resolution multi-channel digital audio recordings albums. DSD samples an audio signal at a fixed rate (frequency) just as in the PCM method. However, instead of recording the volume or amplitude as an absolute number, as in PCM, the DSD method measures and records how much the volume has changed since the last measurement. If the signal is sampled fast enough, the amount of change since the previous sample is very small, and the change in signal strength can be represented with one bit.

One component in DVD players is a digital to analog converter (DAC) that converts digital signals to analog signals for output to analog devices, such as audio speakers. While a single DAC can process multiple signals, the signals must all have the same sample rate. Thus, the various channels must all be converted to the same sample rate before being input to the DAC.

It is therefore desirable to provide an apparatus that is capable of processing D/A conversions for multiple channels with input signals having two or more different sample rates.

SUMMARY

In accordance with the present invention, multiple digital input signals sampled at different rates are converted to analog signals using a different digital to analog converter for each digital input signal. A set of sample rate signals indicating the sampling rate for each digital input signal are used to route each digital input signal, along with a corresponding clock signal, to a digital to analog converter (DAC). A clock error signal controls the power-up of each DAC. A clock divider and ratio detector module generates the clock error signal based on intermediate clock error signals that correspond to the sample rates.

In one embodiment, a first digital to analog converter is coupled to receive a first clock signal and a first digital input signal corresponding to a first sample rate, and a second digital to analog converter is coupled to receive a second clock signal and a second digital input signal corresponding to a second sample rate.

One aspect of this embodiment includes a control router coupled to receive the first and second digital input signals, the first and second clock signals, and first and second control signals. The first and second control signals include an indicator of the sample rate of the first and second digital input signals. The control router is operable to route the first digital input signal and the first clock signal to the first digital to analog converter, and to route the second digital input signal and the second clock signal to the second digital to analog converter.

Another aspect of this embodiment includes a serial interface coupled to the first and second digital to analog converters, wherein the serial interface transmits the first digital input signal to the first digital to analog converter, and the second digital input signal to the second digital to analog converter.

Another aspect of this embodiment includes a plurality of digital to analog converters corresponding to the plurality of digital input signals. The control router transmits at least two of the plurality of digital input signals to the corresponding digital to analog converter, and the remaining plurality of digital input signals are input directly to the corresponding digital to analog converter.

In another embodiment, a control router receives the sample rate signals. Other control signals such as power down, power up, and reset, generated by a state machine for each sample rate, can also be input to the control router. A first and second DAC, and a serial interface are coupled to the control router and the serial interface transmits the digital input signals to the control router. The control router transmits the first and second clock signals and corresponding digital input signals to the first and second DACs, respectively.

One feature of an apparatus in accordance with the present invention is a master =clock that generates a master clock signal. A clock divider and ratio detector module determines a master clock mode based on the first and second clock signals, and the master clock signal. The clock divider and ratio detector also generates a first clock error signal to indicate whether the master clock mode has been determined for the first clock signal, and a second clock error signal to indicate whether the master clock mode has been determined for the second clock signal. An overall clock error signal can be determined based on the first clock error signal and the second clock error signal.

Another feature of an apparatus in accordance with the present invention is a first state machine coupled between the clock divider and ratio detector module and the control router. The first state machine generates at least one of the control signals based on the overall clock error signal and the frame clock for the first sample rate. The apparatus can also include a second state machine coupled between the clock divider and ratio detector module and the control router. The second state machine generates at least one of the control signals based on the overall clock error signal and the frame clock for the second sample rate.

In another embodiment, an apparatus in accordance with the present invention includes a plurality of digital to analog converters corresponding to the plurality of digital s input signals and the control router transmits each of the plurality of digital input signals to the corresponding digital to analog converter.

In yet another embodiment, a plurality of state machines corresponding to each sample rate, is included in the apparatus. Each state machine receives a clock error signal, and transmits the clock error signal to the control router to control operation of the plurality of digital to analog converters.

In certain embodiments of an apparatus in accordance with the present invention, the various components can be implemented as hardware circuitry, as software program instructions executable on a data processor, or a combination of hardware and software.

In another embodiment, a method for converting a plurality of digital input signals sampled at multiple sampling rates to analog signals in accordance with the present invention includes:

generating a clock error signal, wherein the clock error signal is based on two or more clock signals corresponding to different sampling rates, and routing each of the digital input signals, and the clock signal corresponding to the sampling rate of the digital input signal, to one of a plurality of digital to analog converters, when the clock error signal is at a predetermined value.

In one embodiment of the method in accordance with the present invention, generating the clock error signal includes generating intermediate clock error signals corresponding to each of the different sample rates, wherein each of the intermediate clock error signals is based on the clock signal that corresponds to the sample rate, and generating the clock error signal based on the intermediate clock error signals.

In another embodiment of the method in accordance with the present invention, generating the clock error signal further comprises generating clock mode signals corresponding to each of the different sample rates, wherein each of the clock mode signals is based on the clock signal that corresponds to the sample rate, generating the clock error signal based on the clock mode signals.

In a further embodiment of the method in accordance with the present invention, generating the clock error signal further comprises generating clock wait signals corresponding to each of the different sample rates, wherein each of the clock wait signals is based on whether the clock signal that corresponds to the sample rate is rising, and generating the clock error signal based on the clock wait signals.

These and other embodiments of the invention are further described below with respect to the following figures.

DESCRIPTION OF THE FIGURES

FIGS. 4a–4q are examples of time history diagrams for signals in a signal processing system in accordance with an embodiment of the present invention.

DETAILED DESCRIPTION

Figure 1:
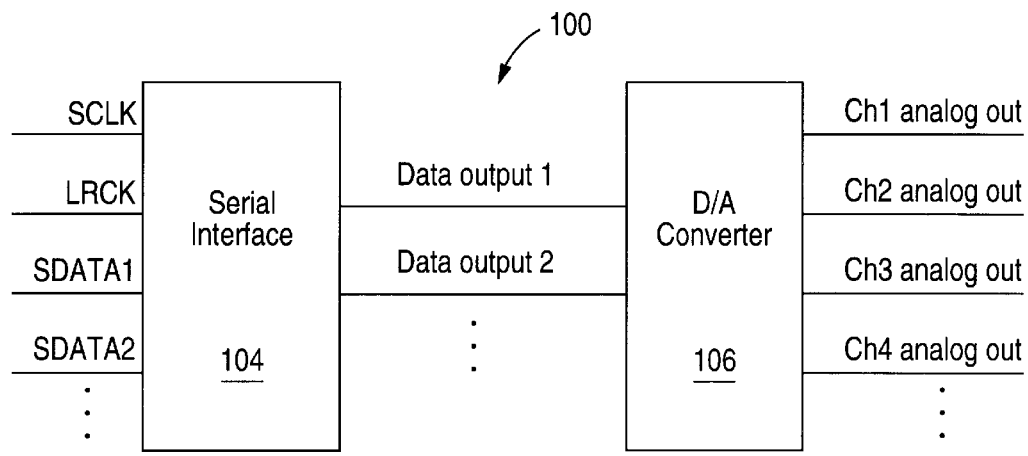
FIG. 1 is a block diagram of components included in a single rate, multichannel signal processing system for converting digital signals to analog signals.

FIG. 1 is a diagram of components included in a multi-channel, single sample rate, signal processing system 100 for converting digital signals to analog signals. Signal processing system 100 includes serial interface 104 configured to receive input signals including sampling clock signal (SCLK), left-right clock signal (LRCK), and multi-bit digital data through serial data signals (SDATA1, SDATA2, . . . SDATAn). Serial interface 104 is timed by the sampling clock (SCLK). The left and right channel data are alternately processed in response to the left-right clock (LRCK), which normally is the same rate as the data input rate (i.e., the sampling rate). All serial data signal inputs are required to have the same sample rate in signal processing system 100 since there is only one set of clock signals (i.e., SCLK and LRCK) for all of the data signals. The data output signals from serial interface 104 are then input to digital to analog converter 106.

Figure 2:
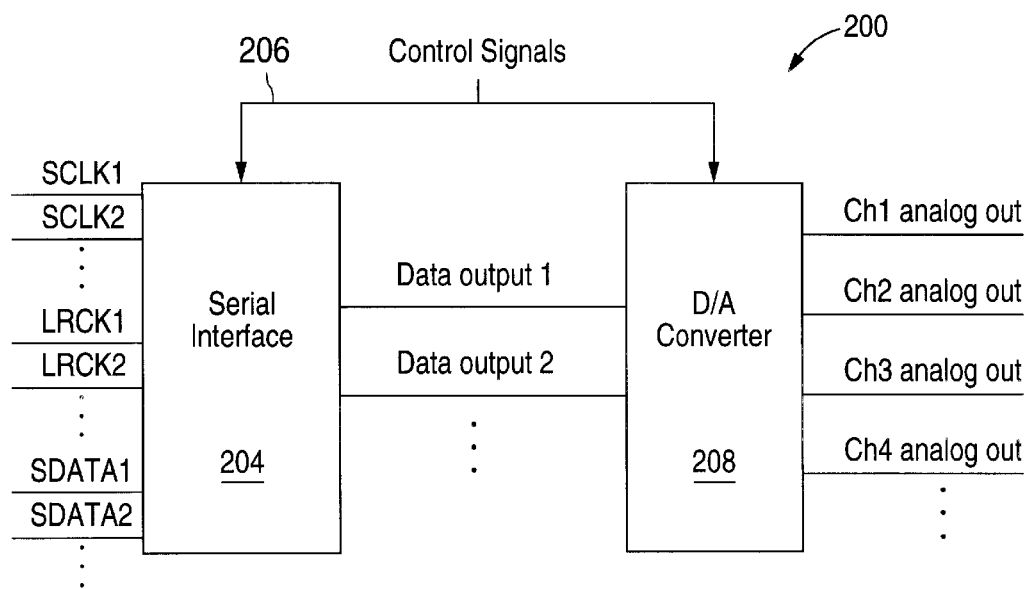
FIG. 2 is a block diagram of components included in a multi-rate, multichannel signal processing system for converting digital signals to analog signals in accordance with an embodiment of the present invention.

Referring now to FIG. 2, a diagram of components included in a multi-channel, multi-sample rate signal processing system 200 for digital to analog signal conversion in accordance with the present invention is shown. In one embodiment, multiple sets of clock signals (i.e., SCLK1/LRCK1, SCLK2/LRCK2, . . . SCLKm/LRCKm) corresponding to the number of different sample rates of serial data signals (SDATA1, SDATA2, . . . SDATAn) are input to serial interface 204. The serial data signals can each have a different sample rate. Alternatively, a group of one or more of the serial data signals can have the same sample rate, with different groups having different sample rates.

Signal processing system 200 includes control signals 206 to indicate the sample rate for each data signal, or group of signals. In one embodiment, the control signals 206 can be implemented as a set of input pins having a state that indicates the sample rate for one or more corresponding data signals. In another embodiment, the control signals 206 can be implemented with registers that hold values indicative of the sample rate for one or more corresponding data signals.

Serial interface 204 clocks each serial data signal using the corresponding LRCK and SCLK signals indicated by control signals 206 (i.e., SCLK/LRCK1, SCLK2/LRCK2, . . . or SCLKm/LRCKm). Each stereo pair of signals is then output in parallel with other stereo pairs by serial interface 204 to digital to analog converter 208.

Figure 3:
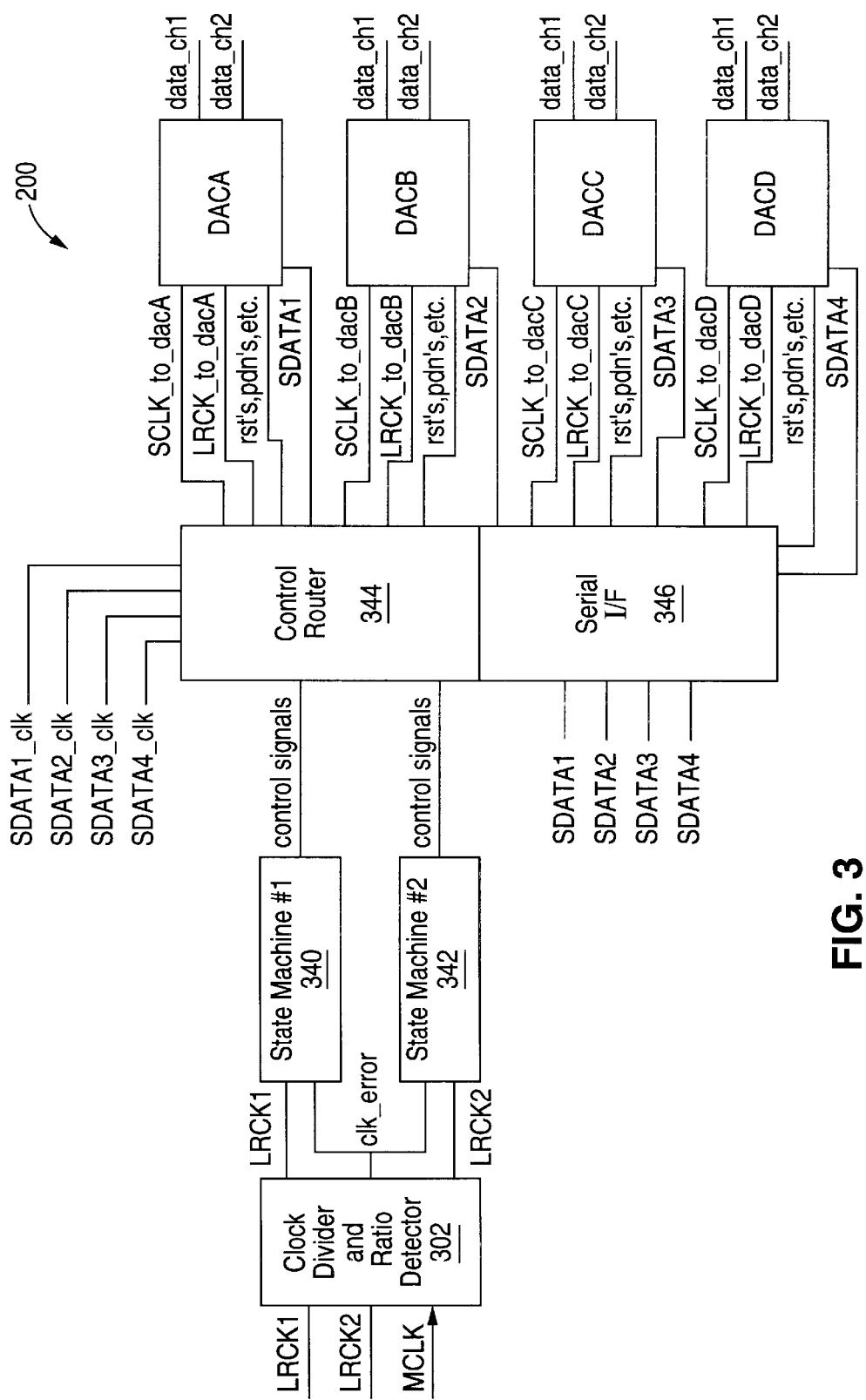
FIG. 3 is a block diagram of components included in a multi-rate, multichannel signal processing system for converting digital signals to analog signals in accordance with an embodiment of the present invention.

FIG. 3 shows a diagram of components included in a further embodiment of signal processing system 200 for processing four serial data inputs, SDATA1, SDATA2, SDATA3, and SDATA4 at two different sampling rates, LRCK1 and LRCK2. It is important to note that other embodiments of a signal processing system in accordance with the present invention can be implemented to handle additional or fewer sample rates and serial data input signals than the system 200 in FIG. 3.

Clock divider and ratio detector 302 derive the clocks necessary to drive the circuit blocks of digital to analog converters DACA, DACB, DACC, and DACD from Lft/right clock inputs LRCK1, LRCK2, and a received master clock (MCLK). The master clock can be operating at one of several rates such as 512 times 48 kHz, for example.

Figure 3A:
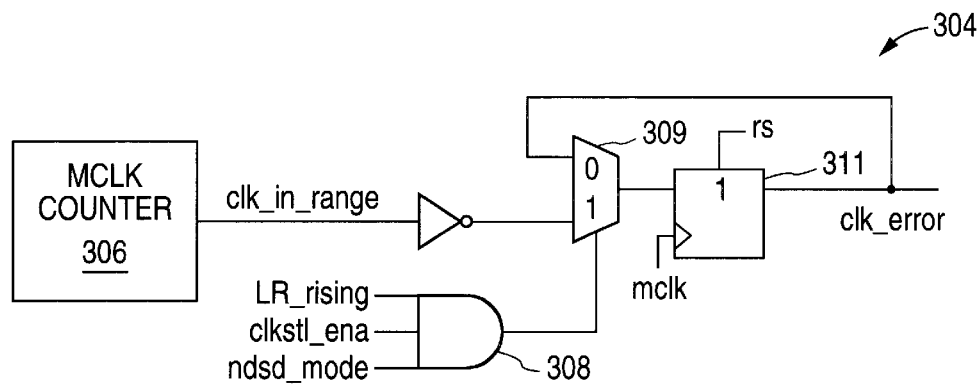
FIG. 3a is a logic circuit for determining the value of a signal to indicate a clock error in accordance with an embodiment of the present invention.
Figure 3B:
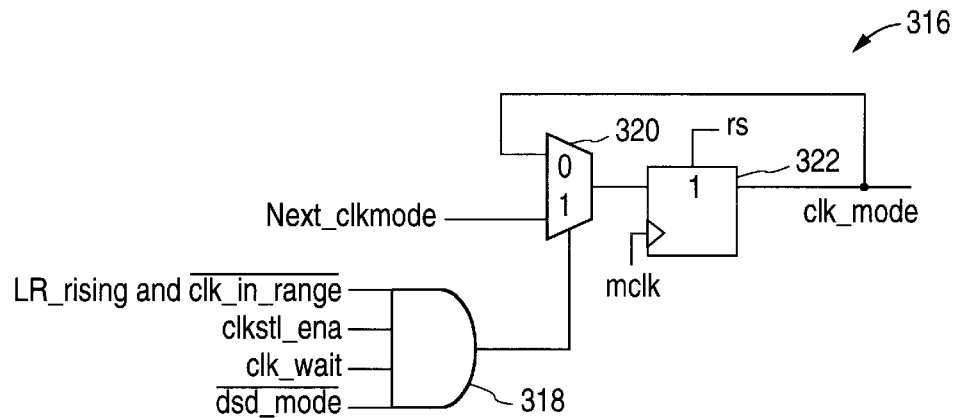
FIG. 3b is a logic circuit for determining the value of a signal to indicate the clock mode in accordance with an embodiment of the present invention.
Figure 3C:
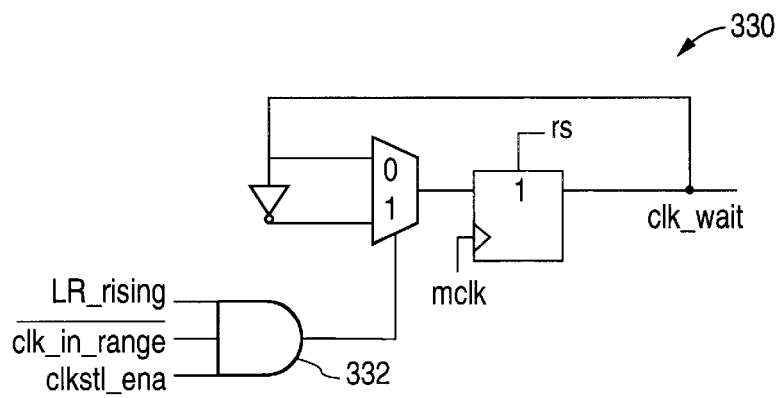
FIG. 3c is a logic circuit for determining the value of a signal to indicate clock waiting in accordance with the present invention.

FIGS. 3a–3c show an embodiment of clock divider and ratio detector 302 implemented in hardware circuitry, however, logic for performing the functions can be implemented in software program instructions, firmware program instructions, or a combination of software, firmware, and/or hardware.

Signal processing system 200 can operate in DSD and PCM modes. In one embodiment shown in FIG. 3a, MCLK counter 306 is incremented each MCLK cycle and is used to detect the ratio of LRCKn to MCLK. One or more ratios can be detected, and values of the ratios are based on the operating speed of system 200 (FIG. 2). For example, one embodiment of system 200 can operate in single, double, or quad-speed mode, and the clock ratios of LRCKn//MCLK that are supported in single speed mode include 128×, 192×, 256×, 384×, 512×, 768×, and 1024×.

A clock in range signal (clk_in_range) is set to indicate whether the MCLK counter 306 is within a range of predetermined values at the rising edge of each LRCKn. For example, in single speed mode, the clk_in_range signal is set to indicate whether the value of the MCLK counter 306 is between 253 and 257 since the last LRCKn rising edge. In the same example, the counter range for setting the clk_in_range signal is between 125 and 129 in double speed mode, and between 61 and 65 in quad-speed mode.

On the rising edge of LRCKn, represented by the LR_rising signal, the circuit in FIG. 3a sets a clock error signal (clk_error) based on whether the clk_in_range signal indicates that the MCLK counter 306 is in an acceptable range and the output of AND gate 308. The inputs to AND gate 308 include a variable to indicate when LRCKn is rising (LR_rising), a clock settle enable signal (clkst1_ena) to indicate that the device is in a mode where the clock ratio is correct, and the DSD mode signal to indicate that system 200 is not operating in DSD mode, where clock ratios are not used. The clkstl_ena signals are enabled by state machines 340, 342, (FIG. 3) and are asserted only during states when the clock ratios need to be correct. For example, during the first few states after reset is released, the clock ratio is not checked, clkstl_ena is not asserted. The clocks have to be resolved to the correct ratio, however, so clkstl_ena is enabled before enabling operation of control router 344 and serial interface 346.

In one implementation, the function of circuit 304 is to hold the previous value of the clk_error signal until the AND gate 308 outputs a "1", indicating a rising edge on the LR_rising signal. At this point, the clk_error signal is updated with the clk_in_range signal. In the implementation shown in FIG. 3a, the clk error signal is initialized to the value "1" to indicate the presence of a clock error. The clk_error signal is reset to "1" when the circuit 304 is reset, or is placed in powerdown mode.

In the implementation shown in FIG. 3a, when the output of AND gate 308 is "0", the output of mux 309 is the clk_error signal. When the output of AND gate 308 is "1", the output of mux 309 is the clk_in_range signal. Flip-flop circuit 311 changes the value of the clk_error signal to "0" when the MCLK counter 306 is in an acceptable range, and when the output of AND gate 308 is "0". Note that although the clock error circuit 304 in FIG. 3a is implemented using digital logic, it is possible to implement logic to set the clk_error signal that uses other suitable values.

FIG. 3b shows one embodiment of a clock mode circuit 316 that provides a clock mode signal (clk_mode) to indicate which master clock division factor is being used relative to the instruction cycle frequency. The circuit 316 increments to the next clock mode until the correct mode is determined. In the implementation shown in FIGS. 3a–3c, the correct clock mode is found when the clk_error signal is low. In FIG. 3b, the output of the AND gate 318 will be "0" as long as the clk_in_range signal is high. The value of the clk_mode signal is held. When the clk_in_range signal is high, the clk_error signal is low, and the clk_mode signal is held at its current state.

In one implementation, one of the following four modes and corresponding division factors can be selected:

| Mode | Division Factor |
|---|---|
| 0 | 1 |
| 1 | 1.5 |
| 2 | 2 |
| 3 | 3 |

For example, if an external clock on which the master clock is based is operating at a frequency of 1 MHz, the internal master clock rate would be 1 MHz, 667 kHz, 500 KHz, or 333 kHz for modes 0, 1, 2, or 3, respectively.

On the rising edge of LRCKn, the circuit 316 in FIG. 3b sets a clock mode signal (clk_mode) based on a next clock mode signal (next_clkmode) and the output of AND gate 318. The inputs to AND gate 318 include signals to indicate when LRCKn is rising (LR_rising) and when the MCLK counter 306 is not in an acceptable range (not_clk_in_range), the clock settle enable signal (clkstl_ena), a clock wait signal (clk_wait), and the DSD_mode signal.

The clk_wait signal causes the clock mode circuit 316 to wait for one LRCKn clock cycle after incrementing the clock mode before checking whether the MCLK counter 306 is within an acceptable range. An example circuit for setting the clk_wait signal is shown in FIG. 3c and described hereinbelow. The output of the AND gate 318 and the next_clkmode signal are input to mux 320. When the output of AND gate 318 is 1, indicating a LRCK rising edge, and not_clk_in_range, the flip flop 322 clocks next_clkmode, and clk_mode changes to the next_clkmode value. In one implementation the clk_mode signal is incremented every other time a rising edge is detected, as represented by the LR_rising signal, as long as the clk_error signal is high. The clk_mode signal is not incremented once the clk_error signal is low, as this indicates the correct clock mode has been determined.

FIG. 3c shows an embodiment of a circuit 330 for setting a clock waiting signal (clk_wait). The value of the clk_wait signal is toggled for every LRCKn clock cycle when the correct master clock mode has not been found. The purpose of the clk_wait signal is to allow settle time for the components in circuit 316 (FIG. 3b).

FIGS. 4a–4q show examples of time histories of the signal values in circuits 304, 316, and 330 (shown in FIGS. 3a, 3b, and 3c, respectively) for dual sample rates at 48 kHz and 96 kHz. Referring in particular to FIGS. 4a, 4f, 4l, 4m, and 4n, the clk_mode signal changes after two LRCK1 cycles. After the clk_mode signal changes to "0", both clk_error signals (FIGS. 4m and 4n) go low, and the clk_mode signal does not change after that point. The clk_wait signals in FIGS. 4d and 4i represent the LRCKn signals divided by two so that every other LRCKn rising edge is evaluated instead of every LRCKn edge.

An important aspect of the present invention is that multiple LRCKn signals are processed, instead of processing just one LRCK signal as known in the prior art. In one embodiment, the decision to change the clk_mode signal is based on the LR clock having the slowest rate. For example, in FIGS. 4a–4q, the clk_mode signal does not change until all LRCKn signals have made at least two rising transitions. This is why the clk_wait signal is an input to the AND gate 322 in FIG. 3b. The clk_mode signal is allowed to change only when all clk_wait signals are high.

In one implementation, the clk_in_range signal for the sample rates is determined in single, double, and quad speed modes as discussed hereinabove. Accordingly, the sample rates are multiples of two of each other, for example, 48 kHz and 96 kHz. In other implementations, however, any combination of sample rates can be used by adding a user input to MCLK counter 306 (FIG. 3a), such as via a control register or signal input pin in hardware, or a variable that can be set in software, to control the counter range that is used to set the clk_in_range signal. For example, instead of testing whether MCLK counter 306 since the last LRCKn rising edge is between 253 and 257 in single speed mode, 125 and 129 in double speed mode, and 61 and 65 in quad-speed mode, other ranges can be input by the user to accommodate sampling rates of any desired multiples.

One embodiment of system 200 includes a clock error circuit 304 (FIG. 3a) and a clock wait circuit 330 (FIG. 3c) for each left/right clock signal LRCKn. Referring back to FIG. 3, the clock divider and ratio detector 302 outputs a single clock error signal that is determined by "ORing" the clock error signal for each sampling clock. In an alternate embodiment, each clock error signals can be used independently of the other clock error signals to allow the DACs without clock errors to continue operating.

If one or more of the left/right clock signals is not driven, the corresponding clock error signal is reset to indicate a clock error. In this situation, logic can be included to ignore the clock error signal of the unused left/right clock signal(s) and allow the remaining signals to be processed.

A signal processing system in accordance with the present invention can include a state machine for each sample rate. Alternatively, a single state machine can be used instead of multiple state machines. The state machines utilize the clock error signal to control operation of the remaining components in the signal processing system. For example, system 200 includes state machine 340, which receives left/right clock signal LRCK1 and the clock error signal, and state machine 342, which receives left/right clock signal LRCK2 and the clock error signal. When the clock error signal indicates that the correct master clock mode has not been found, state machines 340, 342 output control signals to suspend operation of control router 344. When the correct master clock mode has been found, system 200 proceeds to power up and begin normal operation.

State machines 340, 342 include logic to transition between one or more states based on various operating criteria. For example, the state of system 200 can transition based on whether PCM or DSD mode is selected, whether the system 200 is powering up or down, and whether a mute option is selected to inhibit audio output. The state of system 200 determines which information is included in the control signals that are output from the state machines 340, 342. During normal operation in the PCM mode, the control signals include the left/right clock signal(s) LRCKn, power up and power down signals, and a variable to indicate the operating mode.

Control router 344 receives serial data clock selection signals (SDATAn_clk) that indicate the corresponding sampling clock signal SCLKn and left/right clock signal LRCKn for each serial data signal SDATAn. In one embodiment, control router 344 includes a control register for each SDATAn_clk signal. The value in the control register can be set by an external device to indicate the LRCK and SCLK that clock each SDATAn input. In alternative embodiments, other mechanisms for setting the values for the SDATAn_clk signals can be included, such as a set of input pins, an application programmer's interface, or other ways known in the art.

Figure 5:
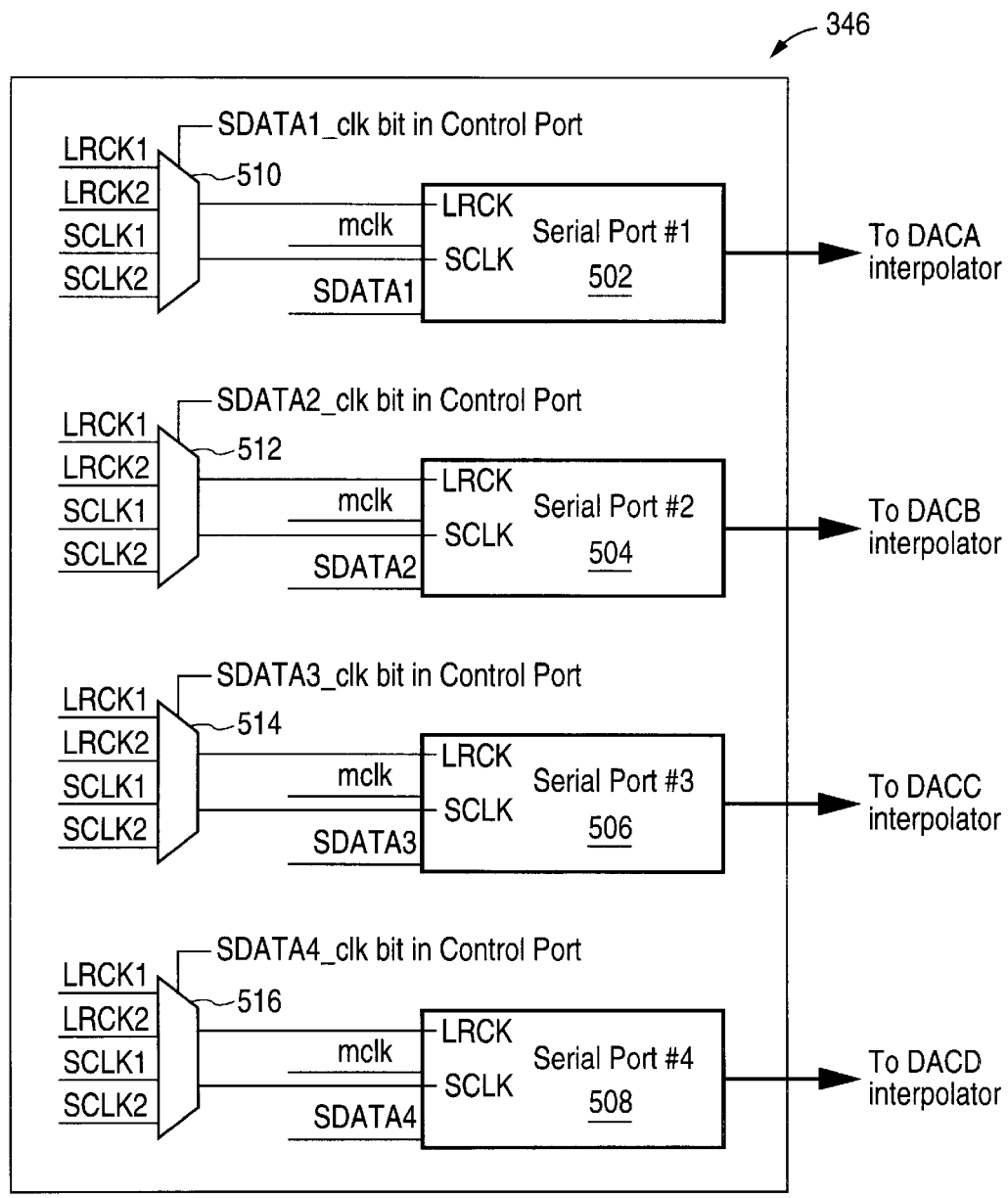
FIG. 5 is a block diagram of components included in an embodiment of a serial interface for a signal processing system in accordance with an embodiment of the present invention.

One embodiment of serial interface 346 is shown in FIG. 5 including a serial port 502, 504, 506, and 508 corresponding to each SDATAn signal. In one embodiment, serial ports 502, 504, 506, and 508 are included in their corresponding DACs and receives the master clock signal MCLK, the corresponding SDATAn signal, a left/right clock signal LRCK, and a sampling clock signal SCLK. Each SDATAn signal is clocked into the serial port using the specified LRCK and SCLK. In this way, each DAC operates independently of the other DACs that may be processing signals at different rates.

In one embodiment, each serial port 502, 504, 506, 508 is coupled to receive the appropriate clock signals from a dedicated multiplexer 510, 512, 514, 516, respectively. The input to each multiplexer 510, 512, 514, 516 includes the serial data clock selection signal (SDATAn_clk) corresponding to the sampling rate of the SDATAn signal being input to the serial port. All of the left/right clock and sampling clock signals, LRCKn and SCLKn used in system 200 (FIG. 2) are input to each multiplexer 510, 512, 514, 516. The SDATAn_clk signal is used to select which clock signals to send to the corresponding serial port.

In another embodiment of serial interface 346, a reduced number of multiplexers can be used and configured with switch logic to provide the appropriate clock signals to more than one serial port. In a further embodiment, the appropriate clock signals can be input directly to one or more serial port, thereby eliminating the need for the multiplexers. This would be useful in devices where the sampling rate of one or more of the signals remains constant, thereby eliminating the need for sample rate selection logic.

Referring again to FIG. 3, serial interface 346 outputs sampling clock signals, shown as SCLK-to-dacA, SCLK-to-dacB, SCLK_to-dacC, and SCLK-to-dacD, to a corresponding digital to analog converter, shown as DACA, DACB, DACC, and DACD. Serial interface 346 also outputs left/right clock signals, shown as LRCK_to_dacA, LRCK_to_dacB, LRCK_to_dacC, and LRCK_to_dacD, and control information such as reset and power down signals, as required. The corresponding analog signal pairs, shown as data_ch1 and data_ch2, are output by DACA, DACB, DACC, and DACD.

In another embodiment, multiple signals of various sampling rates can be processed in accordance with the present invention in a system that does not include control router 344 (FIG. 3). In such a system, the clock signals and corresponding data signals are input directly to the DACs instead of being routed by control router 344. For example, the clock signals SDATA1_clk, SDATA2_clk, SDATA3_clk, and SDATA4_clk, and data signals SDATA1, SDATA2, SDATA3, and SDATA4 in FIG. 3 can be input directly to DACA, DACB, DACC, and DACD. Alternatively, the system can be configured so that control router 344 receives some of the signals, and the rest of the signals are input directly to the DACs. These embodiments are especially useful in devices where the sampling rate of one or more of the data signals remains constant, thereby eliminating the need for sample rate selection logic with respect to those signals.

DAC system 100 advantageously accepts multiple digital input signals at different sample rates and outputs corresponding analog signals. Each stereo digital to analog converter operates independently of the others, given a serial data input signal at the proper rate, and a signal indicating the rate of arrival of the input.

The foregoing detailed description has set forth various embodiments of the present invention via the use of block diagrams, flowcharts, and examples. It will be understood by those within the art that each block diagram component, flowchart step, and operations and/or components illustrated by the use of examples can be implemented, individually and/or collectively, by a wide range of hardware, software, firmware, or any combination thereof.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the spirit and scope of the invention as set forth in the following claims.

We claim:

1. An apparatus for converting a plurality of digital input signals having different sample rates to corresponding analog signals comprising:

a first digital to analog converter coupled to receive a first clock signal and a first digital input signal corresponding to a first sample rate;

a second digital to analog converter coupled to receive a second clock signal and a second digital input signal corresponding to a second sample rate; and a control router coupled to receive the first and second digital input signals, the first and second clock signals, and first and second control signals, wherein the first and second control signals include an indicator of the sample rate of the first and second digital input signals, and further wherein the control router is operable to route the first digital input signal and the first clock signal to the first digital to analog converter, and to route the second digital input signal and the second clock signal to the second digital to analog converter.

2. The apparatus, as set forth in claim 1, further comprising:

a serial interface coupled to the first and second digital to analog converters, wherein the serial interface transmits the first digital input signal to the first digital to analog converter, and the second digital input signal to the second digital to analog converter.

3. The apparatus, as set forth in claim 1, further comprising:

a plurality of digital to analog converters corresponding to the plurality of digital input signals, wherein the control router transmits at least two of the plurality of digital input signals to the corresponding digital to analog converter, and the remaining plurality of digital input signals are input directly to the corresponding digital to analog converter.

4. An apparatus for converting a plurality of digital input signals having different sample rates to corresponding analog signals, comprising:

a control router coupled to receive the digital input signals, a first clock signal corresponding to a first sample rate, a second clock signal corresponding to a second sample rate, and a plurality of control signals, wherein each control signal includes an indicator of the sample rate of one of the digital input signals, and further wherein the control router is operable to route each of the digital input signals based on the sampling rate of the digital input signal.

5. The apparatus, as set forth in claim 4, further comprising:

a first digital to analog converter coupled to the control router; and a serial interface coupled to the control router, wherein the serial interface receives the digital input signals and transmits the digital input signals to the control router, and the control router is further operable to output the first clock signal and a corresponding digital input signal to the first digital to analog converter.

6. The apparatus, as set forth in claim 5, further comprising:

a second digital to analog converter coupled to the control router, wherein the control router is further operable to output the second clock signal and a corresponding digital input signal to the second digital to analog converter.

7. The apparatus, as set forth in claim 4, further comprising:

a master clock outputting a master clock signal; and a clock divider and ratio detector module, wherein the clock divider and ratio detector module is coupled to provide input to the control router, further wherein the clock divider and ratio detector module is operable to determine a master clock mode based on the first clock signal, the second clock signal, and the master clock signal.

8. The apparatus, as set forth in claim 7, wherein the clock divider and ratio detector is further operable to generate:
   a first clock error signal to indicate whether the master clock mode has been determined for the first clock signal, and
   a second clock error signal to indicate whether the master clock mode has been determined for the'second clock signal.

9. The apparatus, as set forth in claim 8, wherein the clock divider and ratio detector module is further operable to generate an overall clock error signal based on the first clock error signal and the second clock error signal.

10. The apparatus, as set forth in claim 9, further comprising:
   a first state machine coupled between the ratio detector and the clock divider and ratio detector module, wherein the first state machine generates at least one of the control signals based on the overall clock error signal.

11. The apparatus, as set forth in claim 10, further comprising:
   a second state machine coupled between the clock divider and ratio detector module and the control router, wherein the second state machine generates at least one of the control signals based on the overall clock error signal.

12. The apparatus, as set forth in claim 4, further comprising:
   a plurality of digital to analog converters corresponding to the plurality of digital input signals, where the control router transmits each of the plurality of digital input signals to the corresponding digital to analog converter.

13. A method for converting a plurality of digital input signals to analog signals, wherein at least some of the digital input signals are sampled at different sampling rates, the method comprising:
   generating a clock error signal, wherein the clock error signal is based on two or more clock signals corresponding to the different sampling rates; and
   routing each of the digital input signals, and the clock signal corresponding to the sampling rate of the digital input signal, to one of a plurality of digital to analog converters, when the clock error signal is at a predetermined value.

14. The method, as set forth in claim 13, wherein generating the clock error signal further comprises:
   generating intermediate clock error signals corresponding to each of the different sample rates, wherein each of the intermediate clock error signals is based on the clock signal that corresponds to the sample rate; and
   generating the clock error signal based on the intermediate clock error signals.

15. The method, as set forth in claim 13, wherein generating the clock error signal further comprises:
   generating clock mode signals corresponding to each of the different sample rates, wherein each of the clock mode signals is based on the clock signal that corresponds to the sample rate; and
   generating the clock error signal based on the clock mode signals.

16. The method, as set forth in claim 13, wherein generating the clock error signal further comprises:
   generating clock wait signals corresponding to each of the different sample rates, wherein each of the clock wait signals is based on whether the clock signal that corresponds to the sample rate is rising; and
   generating the clock error signal based on the clock wait signals.

17. An apparatus for converting a plurality of digital input signals to analog signals, wherein at least some of the digital input signals are sampled at different sampling rates, the apparatus comprising:
   means for generating a clock error signal, wherein the clock error signal is based on two or more clock signals corresponding to the different sampling rates; and
   means for routing each of the digital input signals, and the clock signal corresponding to the sampling rate of the digital input signal, to one of a plurality of digital to analog converters, when the clock error signal is at a predetermined value.

18. The apparatus, as set forth in claim 17, wherein the means for generating the clock error signal farther comprises:
   means for generating intermediate clock error signals corresponding to each of the different sample rates, wherein each of the intermediate clock error signals is based on the clock signal that corresponds to the sample rate; and
   means for generating the clock error signal based on the intermediate clock error signals.

19. The apparatus, as set forth in claim 17, wherein the means for generating the clock error signal further comprises:
   means for generating clock mode signals corresponding to each of the different sample rates, wherein each of the clock mode signals is based on the clock signal that corresponds to the sample rate; and
   means for generating the clock error signal based on the clock mode signals.

20. The apparatus, as set forth in claim 17, wherein the means for generating the clock error signal further comprises:
   means for generating clock wait signals corresponding to each of the different sample rates, wherein each of the clock wait signals is based on whether the clock signal that corresponds to the sample rate is rising; and
   means for generating the clock error signal based on the clock wait signals.

21. An apparatus for converting a plurality of digital input signals to analog signals, wherein the digital input signals are sampled at one of two or more sample rates, the apparatus comprising:
   a serial interface coupled to receive the plurality of digital input signals;
   a control router in communication with the serial interface, wherein the control router is operable to receive a plurality of signals indicating the sample rate of each of the digital input signals, and farther wherein the control router is operable to route each of the digital input signals, and a clock signal corresponding to the sample rate of the digital input signal, to one of a plurality of digital to analog converters.

22. The apparatus, as set forth in claim 21, further comprising:
   a clock divider and ratio detector module operable to generate a clock error signal that is used to control operation of the control router, wherein the clock error signal is based on the clock signals corresponding to the sample rates.

23. The apparatus, as set forth in claim 22, wherein the clock divider and ratio detector module is further operable to:
  generate intermediate clock error signals corresponding to each of the different sample rates, wherein each of the intermediate clock error signals is based on the clock signal that corresponds to the sample rate; and
  generate the clock error signal based on the intermediate clock error signals.

24. The apparatus, as set forth in claim 22, wherein the clock divider and ratio detector module is further operable to:
  generate clock mode signals corresponding to each of the different sample rates, wherein each of the clock mode signals is based on the clock signal that corresponds to the sample rate; and
  generate the clock error signal based on the clock mode signals.

25. The apparatus, as set forth in claim 22, wherein the clock divider and ratio detector module is further operable to:
  generate clock wait signals corresponding to each of the different sample rates, wherein each of the clock wait signals is based on whether the clock signal that corresponds to the sample rate is rising; and
  generate the clock error signal based on the clock wait signals.

26. The apparatus, as set forth in claim 21, further comprising:
  a state machine coupled to provide control signals to the control router, wherein the control signals are used to control operation of the plurality of digital to analog converters.

27. The apparatus, as set forth in claim 21, further comprising:
  a plurality of state machines corresponding to the two or more sample rates, wherein each state machine is coupled to receive a clock error signal, and to transmit the clock error signal to the control router, wherein the clock error signal is used to control operation of the plurality of digital to analog converters.

* * * * *